(12) United States Patent
Salman et al.

(10) Patent No.: US 7,560,777 B1
(45) Date of Patent: Jul. 14, 2009

(54) PROTECTION ELEMENT AND METHOD OF MANUFACTURE

(75) Inventors: Akram A. Salman, Santa Clara, CA (US); Stephen G. Beebe, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 451 days.

(21) Appl. No.: 11/270,029

(22) Filed: Nov. 8, 2005

(51) Int. Cl.
*H01L 23/62* (2006.01)
(52) U.S. Cl. .................... 257/355; 257/360
(58) Field of Classification Search ......... 257/355–363, 257/E29.008, E29.015
See application file for complete search history.

(56) References Cited

U.S. PATENT DOCUMENTS

| | | | |
|---|---|---|---|
| 4,602,268 A | 7/1986 | Hartman et al. | |
| 6,605,844 B2 * | 8/2003 | Nakamura et al. | 257/360 |
| 6,624,487 B1 * | 9/2003 | Kunz et al. | 257/355 |

OTHER PUBLICATIONS

Raissi, Farshid, *A Brief Analysis of the Field Effect Diode and Breakdown Transistor*, IEEE Transactions on Electron Devices, vol. 43, No. 2, Feb. 1996, pp. 362-365.

Voldman, S., Hui, D., Warriner, L., Young, D., Howard, J., Assaderaghi, F., Shahidi, G., *Electrostatic Discharge (ESD) Protection in Silicon-on-Insulator (SOI) CMOS Technology with Aluminum and Copper Interconnects in Advanced Microprocessor Semiconductor Chips*, EOS/ESD Symposium 99-105, pp. 2A.6.1-2A.6.11.
Ker, Ming-Dou, Hung, Kei-Kang, Tang, Howard T.H., Huang, S. C., Chen, S.S., Wang, M.C., *Novel Diode Structures and ESD Protection Circuits in a 1.8-V 0.15 μm Partially-Depleted SOI Salicided CMOS Process*, Proceedings of 8th IPFA, 2001, Singapore, pp. 91-96.
Gopalakrishnan, Kailash, Griffin, Peter B., Plummer, James D., *I-MOS: A Novel Semiconductor Device with a Subthreshold Slope lower than kT/q*, IEDM, 2002, pp. 289-292.

* cited by examiner

*Primary Examiner*—Cuong Q Nguyen
(74) *Attorney, Agent, or Firm*—Farjami & Farjami LLP (57) ABSTRACT

An electrostatic discharge ("ESD") protection circuit having dynamically configurable series-connected diodes and a method for manufacturing the ESD protection circuit. A doped region of P-type conductivity and a doped region of N-type conductivity are formed in an SOI layer of P-type conductivity, wherein the doped regions are laterally spaced apart by a portion of the SOI layer. At least one gate structure is formed on the SOI region that is between the N-type and P-type doped regions. During normal operation, a portion of the SOI region that is adjacent to and between the P-type and N-type doped regions is biased so that it becomes a region of N-type conductivity, thereby forming two series-connected diodes. During an ESD event, the bias is changed so that the region between the P-type and N-type doped regions becomes a region of P-type conductivity, thereby forming a single P-N junction diode.

13 Claims, 6 Drawing Sheets

PROTECTION ELEMENT AND METHOD OF MANUFACTURE

FIELD OF THE INVENTION

The present invention relates, in general, to semiconductor components and, more particularly, to the protection of semiconductor components from transient electrical signals.

BACKGROUND OF THE INVENTION

Semiconductor component manufacturers typically include structures for protecting their devices against failure caused by large transient electrical stimuli. When the stimulus is an electrostatic discharge ("ESD") event, manufacturers generally incorporate protection structures that account for failure mechanisms attributed to the Human Body Model ("HBM") and to the Charged Device Model ("CDM"). The Human Body Model simulates electrostatic discharge from a human body to a semiconductor device that is sensitive to the discharge event. Here, charge accumulated on the human body discharges to the semiconductor device. The Charged Device Model simulates the discharge of charge accumulated on the semiconductor device itself during the assembly process. When these charged devices contact metal objects, a discharge event occurs which is short in duration accompanied by peak currents capable of exceeding ten amperes.

To protect against these events, semiconductor component manufacturers incorporate ESD protection structures into their components. They are coupled to input and output ("I/O") pads of the semiconductor devices to prevent device failure due to positive and negative voltage excursions that may appear on the I/O pads. To provide maximal ESD protection, it is desirable to increase the discharge path for ESD induced current by making the ESD protection structures large. However, large ESD protection structures occupy large areas on the semiconductor substrate, which increases the costs associated with manufacturing the semiconductor component. In addition, making the ESD protection structures large increases the capacitance associated with the input and output pads to which they are coupled. In high frequency applications, increasing the capacitance of the ESD protection structure increases the Resistance-Capacitance ("RC") time constant of the pin coupled to the bond pad, which makes the devices unacceptably slow.

Accordingly, it would be advantageous to have an ESD protection structure with reduced capacitance during normal operation and a method for lowering the capacitance of the ESD protection structure. It would be of further advantage for the method and ESD protection structure to be cost efficient.

SUMMARY OF THE INVENTION

The present invention satisfies the foregoing need by providing an ESD protection element with a dynamically adjustable number of series-connected diodes. In accordance with one aspect, the ESD protection element comprises a semiconductor-on-insulator substrate of a first conductivity type. A first doped region of the first conductivity type extends from a first portion of the major surface into the semiconductor-on-insulator substrate. A second doped region of a second conductivity type extends from a second portion of the major surface into the semiconductor-on-insulator substrate. The first and second doped regions are laterally spaced apart from each other by a substrate region. A first gate structure is asymmetrically positioned on the substrate region.

In accordance with another aspect, the present invention includes a method for manufacturing an ESD protection device in which a semiconductor-on-insulator substrate having a major surface is provided. The semiconductor-on-insulator substrate comprises a first layer of semiconductor material, a first layer of dielectric material disposed on the first layer of semiconductor material, and a second layer of semiconductor material disposed on the first layer of semiconductor material. The second layer of semiconductor material has a major surface, a first dopant concentration, and a first conductivity type. A first doped region of the first conductivity type and a second dopant concentration is formed in the second layer of semiconductor material. A second doped region of a second conductivity type and a third dopant concentration is formed in the second layer of semiconductor material, wherein the second doped region is laterally spaced apart from the first doped region by a portion of the second layer of semiconductor material. The portion of the second layer of semiconductor material has a first dopant concentration and a first conductivity type. At least one gate structure is formed on the second layer of semiconductor material such that the at least one gate structure is asymmetrically positioned over the portion of the second layer of semiconductor material of the first conductivity type and the first dopant concentration.

In accordance with yet another aspect, the present invention comprises a method for protecting a circuit or a circuit element during an electrostatic discharge event by configuring a semiconductor material to comprise at least two diodes coupled in series during a first operating mode, and configuring the semiconductor material to comprise one diode during a second operating mode.

BRIEF DESCRIPTION OF THE DRAWINGS

The present invention will be better understood from a reading of the following detailed description, taken in conjunction with the accompanying drawing figures, in which like reference characters designate like elements and in which.

DETAILED DESCRIPTION

Generally, the present invention provides a means for dynamically forming series-connected diodes, wherein the diodes are suitable for use in protecting circuits from damage caused by transient electrical signals such as, for example, an electrostatic discharge event. In accordance with one aspect, the present invention includes a diode structure formed from a Semiconductor-On-Insulator ("SOI") substrate. The SOI substrate comprises an SOI layer having one of an initial dopant concentration or an intrinsic dopant concentration coupled to a layer of insulating material. In an embodiment in which the SOI layer is a P-type conductivity material, a region of the SOI layer is doped with an impurity material or dopant of P-type conductivity and another region of the SOI layer is doped with an impurity material of N-type conductivity. The regions of P-type conductivity and N-type conductivity are separated by a portion of the SOI layer having either the initial dopant concentration or the intrinsic dopant concentration. This semiconductor region is referred to as the diode multiplication region. One or more gate structures are asymmetrically positioned over the diode multiplication region. The gate structures are biased to either invert, enhance, or not affect the portions of the diode multiplication region underlying the gate structures. By changing the conductivity type of a portion of the diode multiplication region or leaving it unchanged, one or more additional series-connected diodes are formed in the diode multiplication region. The number of diodes can be selected using Equation 1 (Eqt. 1):

Number of diodes=$(n/2)+1$         Eqt. 1 where n is the number of gate structures formed over the diode multiplication region.

Figure 1:
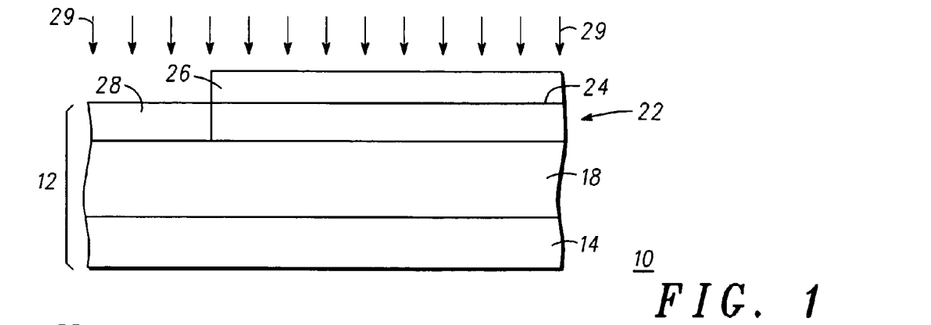
FIG. 1 is a cross-sectional side view of a protection element comprising a gated diode at an early stage of manufacture in accordance with an embodiment of the present invention.

FIG. 1 is a cross-sectional side view of a semiconductor component 10 comprising a gated lateral diode at an early stage of manufacture in accordance with an embodiment of the present invention. What is shown in FIG. 1 is an SOI substrate 12 comprising a layer of insulating material 18 sandwiched between two layers of semiconductor material 14 and 22. Preferably, semiconductor material 14 is monocrystalline silicon of P-type conductivity and a thickness ranging from approximately 500 micrometers to approximately 1,000 micrometers; insulating material 18 is oxide having a thickness ranging from approximately 1,000 Angstroms (Å) to approximately 2,000 Å; and semiconductor material 22 is monocrystalline silicon of P-type conductivity having a surface 24 and a thickness of less than approximately 750 Å so that it becomes fully depleted during an ESD event. Layer 22 is also referred to as a semiconductor-on-insulator layer or an SOI layer. Techniques for manufacturing SOI substrate 12 are known to those skilled in the art. It should be understood that the type of material, conductivity types, and thicknesses of semiconductor materials 14 and 22 and dielectric material 18 are not limitations of the present invention. Typically, silicon layer 14 provides structural support for substrate 12 whereas silicon layer 22 serves as an active layer. However, this is not a limitation of the present invention. For example, silicon layers 14 and 22 can serve as active layers or silicon layer 22 can serve as the active layer while silicon layer 14 provides structural support.

A layer of photoresist is formed on SOI layer 22 and patterned to form an implant block mask 26 that covers a portion of SOI layer 22 and leaves a portion of SOI layer 22 exposed. An impurity material of P-type conductivity such as, for example, boron, is implanted into the portions of SOI layer 22 unprotected by implant block mask 26, i.e., the exposed portions of SOI layer 22, to form a doped region 28. By way of example, the P-type impurity material is implanted at a dose ranging from approximately $1\times10^{13}$ ions per square centimeter (ions/cm$^2$) to approximately $5\times10^{14}$ ions/cm$^2$ and an implant energy ranging from approximately 15 kilo-electron Volts (keV) to approximately 30 keV. The implant is indicated by arrows 29. It should be understood that the portions of SOI substrate 12 that do not underlie photoresist layer 26 are unprotected by photoresist layer 26.

Figure 2:
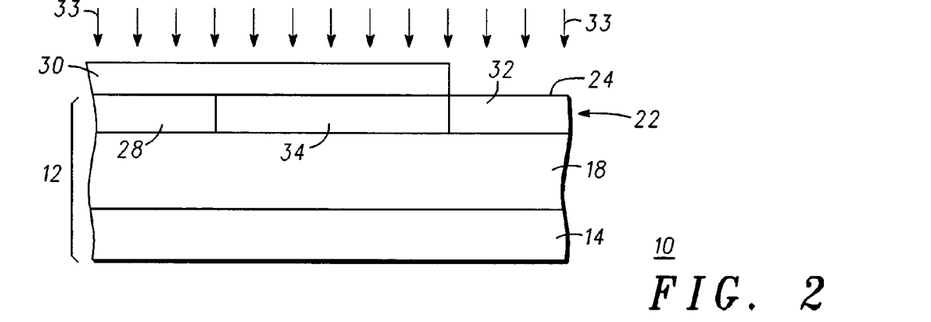
FIG. 2 is a cross-sectional side view of the protection element of FIG. 1 further along in manufacture.

Referring now to FIG. 2, implant block mask 26 is removed using techniques known to those skilled in the art. Another layer of photoresist is formed on SOI layer 22 and patterned to form an implant block mask 30 that covers doped region 28 and a portion of SOI layer 22 adjacent doped region 28, but leaves a portion of SOI layer 22 exposed. An impurity material of N-type conductivity such as, for example, phosphorus, is implanted into the portions of SOI layer 22 unprotected by implant block mask 30, i.e., the exposed portions of SOI layer 22, to form a doped region 32. By way of example, the N-type impurity material is implanted at a dose ranging from approximately $1\times10^{13}$ ions/cm$^2$ to approximately $5\times10^{14}$ ions/cm$^2$ and an implant energy ranging from approximately 15 keV to approximately 30 keV. The implant is indicated by arrows 33. Implant block mask 30 is removed.

Doped region 32 is laterally spaced apart from doped region 28 by a portion 34 of substrate region 22. In accordance with one embodiment, portion 34 of substrate region 22 has the same conductivity type and same dopant concentration as SOI layer 22 before the formation of doped regions 28 and 32. In accordance with another embodiment, portion 34 of substrate region 22 is intrinsic semiconductor material. Because additional diodes will be formed from portion 34 of substrate region 22, it is also referred to as a diode multiplication region.

Figure 3:
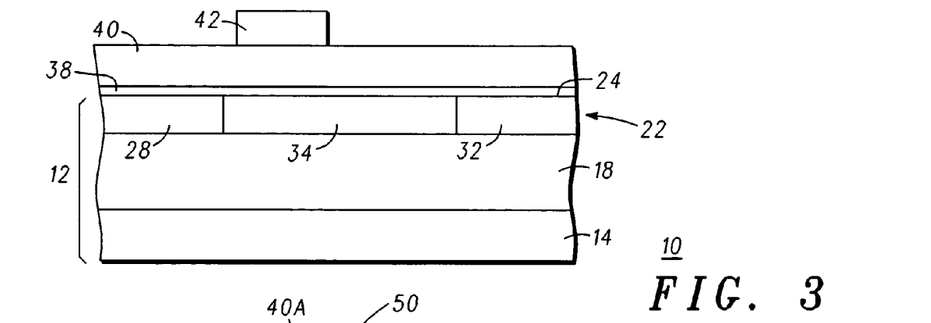
FIG. 3 is a cross-sectional side view of the protection element of FIG. 2 further along in manufacture.

Referring now to FIG. 3, a layer of dielectric material 38 having a thickness ranging from approximately 15 Å to approximately 100 Å is formed on doped regions 28 and 32 and on diode multiplication region 34. A portion of dielectric layer 38 serves as a gate dielectric material and may be formed using techniques known to those skilled in the art including thermal oxidation, chemical vapor deposition, and the like. A layer of polysilicon 40 having a thickness ranging from approximately 550 Å to approximately 2,000 Å is formed on dielectric layer 38. A layer of photoresist is formed on polysilicon layer 40 and patterned to form an etch mask 42. In accordance with one embodiment etch mask 42 is over a portion of diode multiplication region 34 that is adjacent to doped region 28. In accordance with another embodiment, etch mask 42 is over a portion of diode multiplication region 34 that is adjacent to doped region 32. Thus, etch mask 42 is asymmetrically positioned over diode multiplication region 34, i.e., etch mask 42 is not centered or it is off-center over diode multiplication region 34. Etch mask 42 protects the portions of polysilicon layer 40 and dielectric layer 38 over which it is positioned. In other words, the portions of polysilicon layer 40 and dielectric layer 38 that do not underlie etch mask 42 are not protected by etch mask 42.

Figure 4:
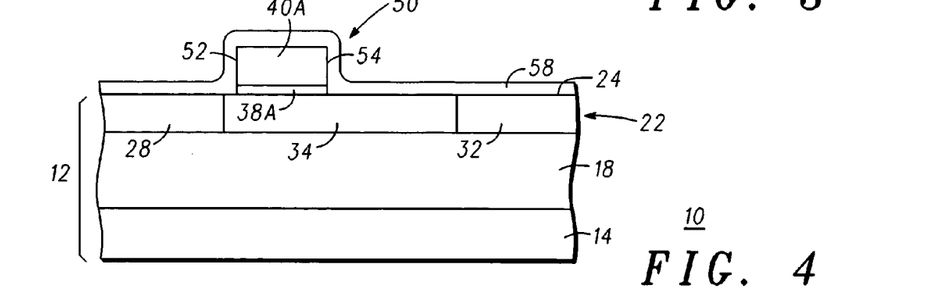
FIG. 4 is a cross-sectional side view of the protection element of FIG. 3 further along in manufacture.

Referring now to FIG. 4, the unprotected portions of polysilicon layer 40 are etched using an etch chemistry that preferentially etches polysilicon and not the underlying dielectric material. By way of example, polysilicon layer 40 is etched using an anisotropic Reactive Ion Etch ("RIE") and an etchant species that preferentially etches polysilicon. After removal of the exposed portions of polysilicon layer 40, the etch chemistry is changed to anisotropically etch dielectric layer 38. The anisotropic etching of dielectric layer 38 stops or terminates on doped regions 28 and 32 and on diode multiplication region 34 leaving a portion 38A of dielectric layer 38 and a portion 40A of polysilicon layer 40. Portions 38A and 40A cooperate to form a gate structure 50 having sidewalls 52 and 54. Portion 38A serves as a gate dielectric and portion 40A serves as a gate conductor. It should be understood that the type of etching is not a limitation of the present invention. For example, a wet etch rather than a dry etch can be used to etch polysilicon layer 40 and dielectric layer 38. After formation of gate structure 50, etch mask 42 is removed.

Still referring to FIG. 4, a layer of dielectric material 58 is formed on gate structure 50, doped regions 28 and 32, and on the exposed portion of diode multiplication region 34. Suitable materials for dielectric layer 58 include oxide, nitride, dielectric materials having a low dielectric constant, and the like. By way of example, dielectric layer 58 is silicon dioxide deposited using a chemical vapor deposition technique. Preferably, silicon dioxide layer 58 has a thickness ranging from approximately 600 Å to approximately 1,500 Å.

Figure 5:
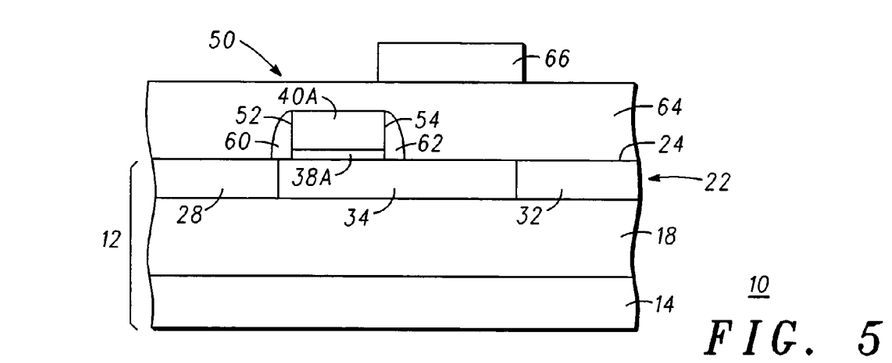
FIG. 5 is a cross-sectional side view of the protection element of FIG. 4 further along in manufacture.

Referring now to FIG. 5, silicon dioxide layer 58 is anisotropically etched to form spacers 60 and 62 adjacent sidewalls 52 and 54, respectively. A layer of dielectric material 64 having a thickness ranging from approximately 5 Å to approximately 30 Å is formed on gate structure 50, spacers 60 and 62, doped regions 28 and 32, and the exposed portion of diode multiplication region 34. Suitable materials for dielectric layer 64 include silicon dioxide, silicon nitride, or the like. Dielectric layer 64 is planarized using a planarization technique such as, for example, chemical mechanical planarization, electropolishing, electrochemical polishing, chemical polishing, chemically enhanced planarization, and the like.

Still referring to FIG. 5, a layer of photoresist is formed on dielectric layer 64 and patterned to form an etch mask 66. Etch mask 66 overlies spacer 62 and portions of diode multiplication region 34 and gate conductor 40A. The exposed portions of dielectric layer 64, i.e., the portions that are not under etch mask 66, are unprotected by etch mask 66.

Figure 6:
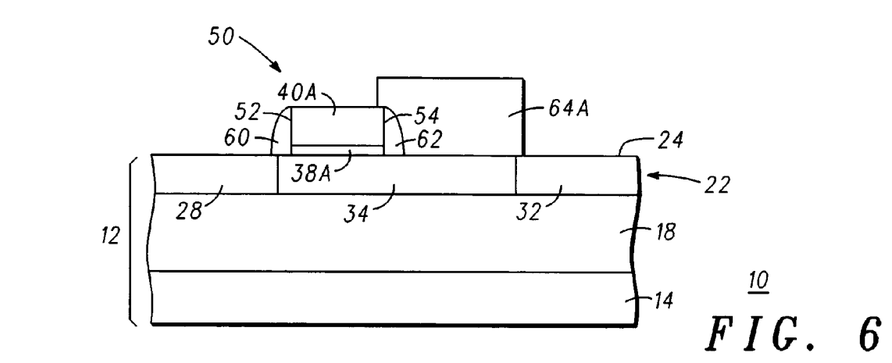
FIG. 6 is a cross-sectional side view of the protection element of FIG. 5 further along in manufacture.

Referring now to FIG. 6, the exposed portions of dielectric layer 64 are anisotropically etched to expose gate conductor 40A and doped regions 28 and 32. After anisotropically etching dielectric layer 64, a portion 64A remains over spacer 62, diode multiplication region 34, a portion of gate electrode 40A, and a portion of doped region 32. Portion 64A prevents diode multiplication region 34 from becoming electrically shorted to doped region 32 during salicide formation which occurs in a subsequent processing step.

Figure 7:
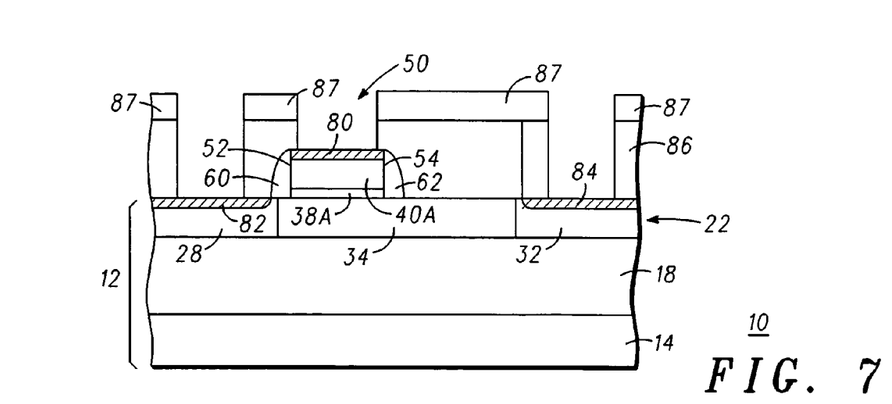
FIG. 7 is a cross-sectional side view of the protection element of FIG. 6 further along in manufacture.

Referring now to FIG. 7, an optional wet etch is performed to remove any oxide from gate electrode 40A and any oxide disposed on the exposed portions of doped regions 28 and 32. A layer of refractory metal (not shown) is deposited on portion 64A and the exposed portions of gate structure 50 and doped regions 28 and 32. By way of example, the refractory metal layer is cobalt having a thickness ranging from approximately 50 Å to approximately 300 Å. The refractory metal is heated to a temperature ranging from approximately 600° C. to approximately 700° C. The heat treatment causes the cobalt to react with the silicon to form cobalt silicide ($CoSi_2$) in all areas in which the cobalt is in contact with silicon. Thus, a cobalt silicide region 80 is formed from gate conductor 40A, a cobalt silicide region 82 is formed from doped region 28, and a cobalt silicide region 84 is formed from doped region 32. The portions of the cobalt disposed on the non-silicon material, e.g., the cobalt disposed on portion 64A, remain unreacted. The unreacted cobalt is removed using processes known to those skilled in the art. It should be understood that the type of silicide is not a limitation of the present invention. For example, other suitable silicides include titanium silicide (TiSi), platinum silicide (PtSi), nickel silicide (NiSi), and the like.

Still referring to FIG. 7, a layer of dielectric material 86 is formed on portion 64A and on silicide regions 80, 82, and 84. By way of example, dielectric material 86 is oxide having a thickness ranging from approximately 5,000 Å to approximately 15,000 Å. Dielectric material 86 is planarized using techniques known to those skilled in the art. A layer of photoresist is formed on dielectric layer 86 and patterned to form an etch mask 87. In accordance with one embodiment etch mask 87 is over silicide regions 80, 82, and 84. Etch mask 87 protects the portions of dielectric layer 86 over which it is positioned. In other words, the portions of dielectric layer 87 that do not underlie etch mask 87 are not protected by etch mask 87. Openings are formed in dielectric layer 86 to expose portions of silicide regions 80, 82, and 84. Using techniques known to those skilled in the art, electrical conductors or electrodes are formed which contact the exposed portions of silicide regions 80, 82, and 84. Etch mask 87 is removed.

Figure 8:
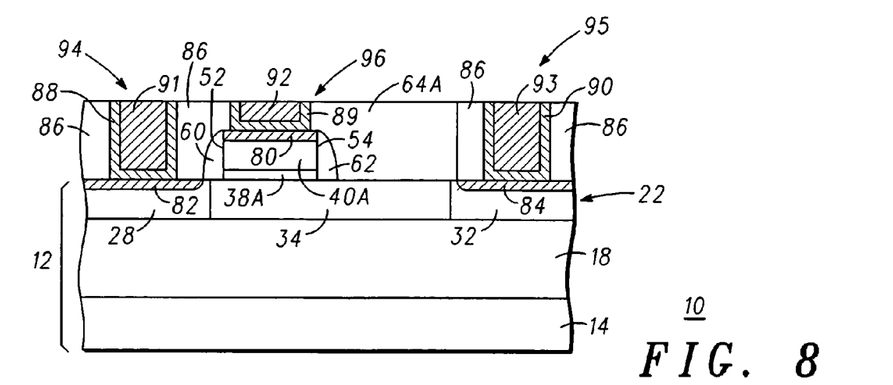
FIG. 8 is a cross-sectional side view of the protection element of FIG. 7 further along in manufacture.

Referring now to FIG. 8, an electrically conductive material having a thickness ranging from approximately 50 Å to approximately 350 Å is formed on the portions of silicide layers 80, 82, and 84 exposed by the openings formed in dielectric layer 86 and on the remaining portion of dielectric layer 86. The electrically conductive material serves as a barrier layer. By way of example, the barrier layer is a bilayer structure comprising a titanium contact layer having a titanium nitride layer formed thereon. Suitable techniques for forming the electrically conductive layer include Chemical Vapor Deposition ("CVD"), Plasma Enhanced Chemical Vapor Deposition ("PECVD"), Atomic Layer Deposition ("ALD"), or the like. Other suitable materials for the electrically conductive material include tantalum (Ta), titanium nitride (TiN), tantalum nitride (TaN), a tantalum (Ta) and tantalum nitride (TaN) combination, tungsten (W), tungsten nitride (WN), titanium silicon nitride (TiSiN), and refractory metal compounds such as refractory metal nitrides, refractory metal carbides, and refractory metal borides. It should be understood that the number of layers for the barrier layer is not a limitation of the present invention.

An electrically conductive material having a thickness ranging from approximately 4,000 Å to approximately 8,000 Å is formed on the barrier layer. By way of example, the electrically conductive material is titanium. Alternatively, the electrically conductive material may be copper, silver, aluminum, or the like. The electrically conductive material is planarized using, for example, a CMP technique having a high selectivity to dielectric layer 86. Thus, the planarization stops on dielectric layer 86. After planarization, portions 88, 89, and 90 of the barrier layer remain and portions 91, 92, and 93 of the electrically conductive material remain. Silicide layer 82, barrier layer 88, and electrically conductive material 91 cooperate to form an anode contact 94. Silicide layer 84, barrier layer 90, and electrically conductive material 93 cooperate to form a cathode contact 95. Silicide layer 80, barrier layer 89, and electrically conductive material 92 cooperate to form a gate electrode 96.

Figure 9:
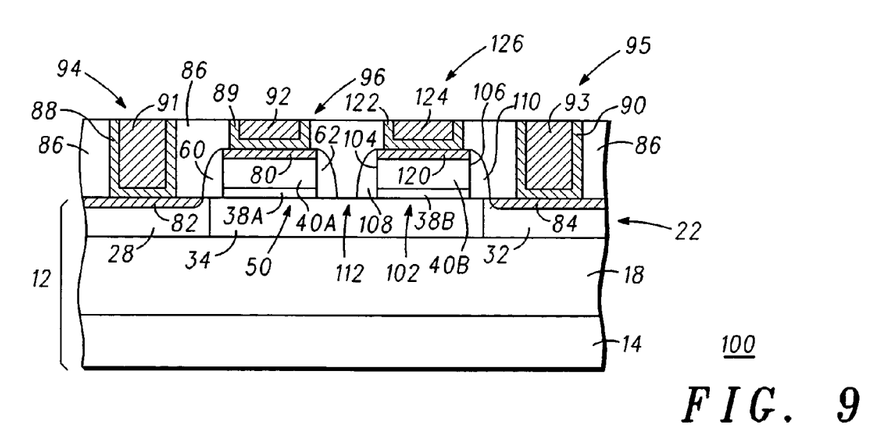
FIG. 9 is a cross-sectional side view of a protection element comprising a gated diode in accordance with another embodiment of the present invention.

FIG. 9 is a cross-sectional side view of a dual-gated lateral diode 100 in accordance with another embodiment of the present invention. Dual-gated lateral diode 100 includes SOI substrate 12 having doped regions 28 and 32 laterally spaced apart by diode multiplication region 34. Dual-gated lateral diode 100 also includes gate structure 50 and spacers 60 and 62 asymmetrically positioned over diode multiplication region 34. In addition, dual-gated lateral diode 100 includes a second gate structure 102 comprising a gate dielectric material 38B, a gate conductor 40B, and a silicide layer 120. Gate structure 102 has sidewalls 104 and 106 and spacers 108 and 110 adjacent sidewalls 104 and 106, respectively. Like gate structure 50, gate structure 102 is asymmetrically positioned on diode multiplication region 34. However, gate structure 102 is laterally adjacent doped region 32. Although gate structures 50 and 102 are laterally spaced apart, they are preferably close enough together to prevent salicide formation from a region 112 that is between gate structures 50 and 102. In addition, the gate structures prevent impurity material from doping diode multiplication region 34. Thus, gate structure 102 prevents doped region 32 from becoming electrically shorted to diode multiplication region 34. Each gate structure is asymmetrically positioned on diode multiplication region 34. However, it should be understood that the combination of gate structures 50 and 102 are preferably positioned such that the combination is symmetrically oriented over diode multiplication region 34. Like gate structure 50, gate structure 102 includes an electrically conductive material 124 disposed on a barrier layer 122. Silicide layer 120, barrier layer 122, and electrically conductive material 124 cooperate to form a gate electrode 126.

Figure 10:
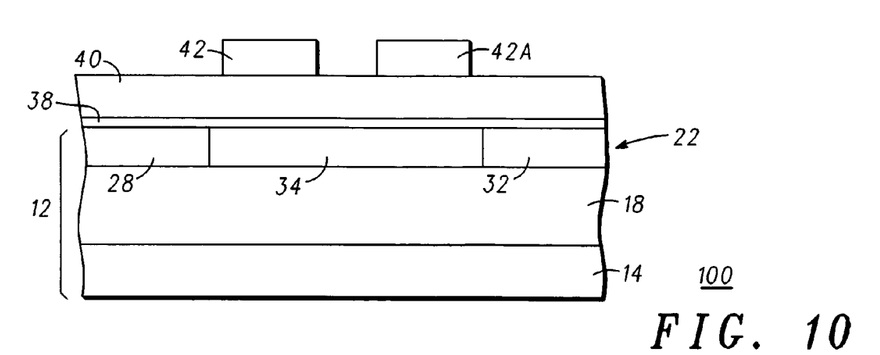
FIG. 10 is a cross-sectional side view of the protection element of FIG. 9 at an earlier stage of manufacture than the stage shown in FIG. 9.

FIG. 10 illustrates a cross-sectional side view of dual-gated lateral diode 100 at an earlier stage of manufacture than that shown in FIG. 9. FIG. 10 is included to clarify how gate structure 102 may be formed. Rather than forming a single etch mask 42 (shown in FIG. 3), a pair of etch masks 42 and 42A are formed from a photoresist layer. Gate structure 102 is formed using steps similar to those described with reference to FIGS. 4-8. However, a dielectric layer such as dielectric layer 64 and a protective structure such as structure 64A are not formed because gate 102 serves as a protective structure.

Figure 11:
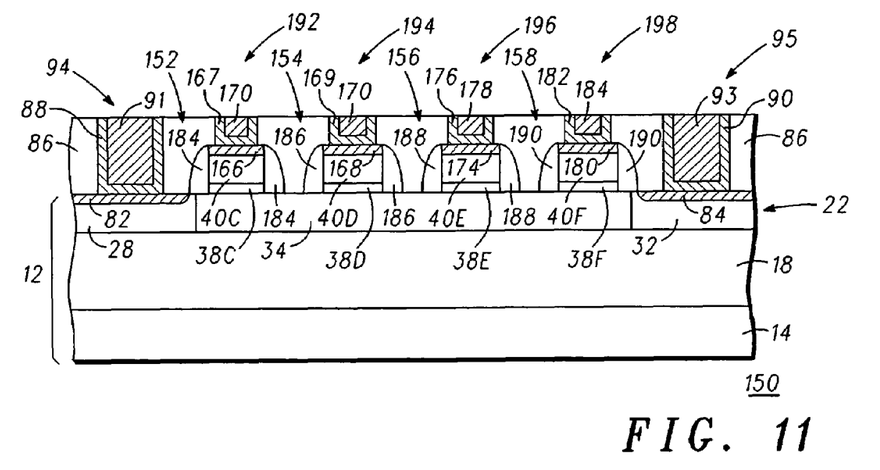
FIG. 11 is a cross-sectional side view of a protection element comprising a gated diode in accordance with yet another embodiment of the present invention.

FIG. 11 is a cross-sectional side view of a multi-gated lateral diode 150 in accordance with another embodiment of the present invention. Multi-gated lateral diode 150 includes SOI substrate 12 having doped regions 28 and 32 laterally spaced apart by diode multiplication region 34. Multi-gated lateral diode 150 also includes gate structures 152, 154, 156 and 158 positioned over diode multiplication region 34. Each gate structure 152, 154, 156, and 158 is asymmetrically positioned over diode multiplication region 34. Like gate structures 50 and 102, gate structures 152, 154, 156, and 158 each include a gate dielectric material disposed on diode multiplication region 34 and a gate conductor disposed on the gate dielectric material. More particularly, gate structure 152 comprises a gate dielectric material 38C, and a gate conductor 40C, gate structure 154 comprises a gate dielectric 38D and a gate conductor 40D, gate structure 156 comprises a gate dielectric material 38E and a gate conductor 40E, and gate structure 158 comprises a gate dielectric material 38F and a gate conductor 40F. The dielectric material of gate dielectric material 38C-38F are portions of dielectric layer 38 described with reference to FIG. 3 and the material of gate conductors 40C-40F are portions of polysilicon layer 40 described with reference to FIG. 3. Spacers 184 are adjacent gate structure 152, spacers 186 are adjacent gate structure 154, spacers 188 are adjacent gate structure 156, and spacers 190 are adjacent gate structure 158. A silicide layer 166, a barrier layer 167, and an electrically conductive material 170 cooperate to form a gate contact 192 to gate structure 152; a silicide layer 168, a barrier layer 169, and an electrically conductive material 170 cooperate to form a gate contact 194 to gate structure 154; a silicide layer 174, a barrier layer 176, and an electrically conductive material 178 cooperate to form a gate contact 196 to gate structure 156; and a silicide layer 180, a barrier layer 182, and an electrically conductive material 184 cooperate to form a gate contact 198 to gate structure 158. Like gate structures 50 and 102, each gate structure 152, 154, 156, and 158 is asymmetrically positioned on diode multiplication region 34. Gate structures 152, 154, 156, and 158 are laterally spaced apart from each other but are close enough to prevent salicide formation on or doping of substrate region 34. Although each gate structure is asymmetrically positioned on diode multiplication region 34, the combination of gate structures 152, 154, 156, and 158 are preferably positioned symmetrically over diode multiplication region 34, i.e., gate structures 152 and 154 are symmetrically positioned with respect to gate structures 156 and 158.

Figure 12:
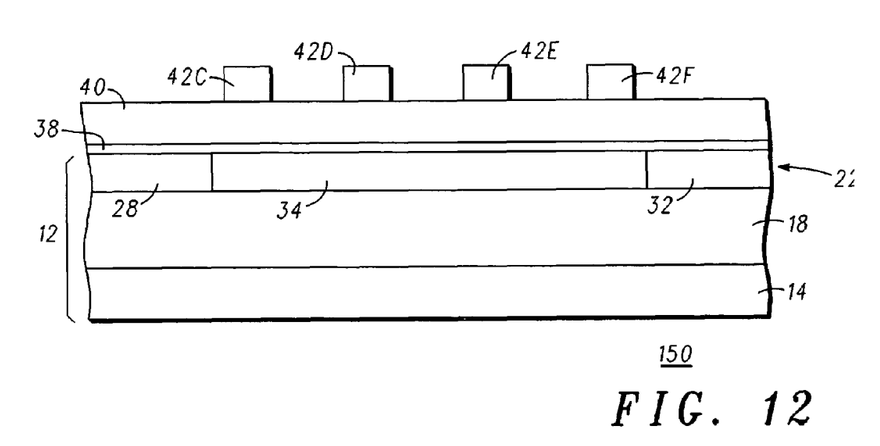
FIG. 12 is a cross-sectional side view of the protection element of FIG. 11 at an earlier stage of manufacture than the stage shown in FIG. 11.

FIG. 12 illustrates a cross-sectional side view of multi-gated lateral diode 150 at an earlier stage of manufacture than that shown in FIG. 11. FIG. 12 is included to clarify how gate structures 152, 154, 156, and 158 may be formed. Rather than forming a single etch mask 42 (shown in FIG. 3), four etch masks 42C, 42D, 42E, and 42F are formed from a photoresist layer. Gate structures 152, 154, 156, and 158 are formed using steps similar to those described with reference to FIGS. 4-8. However, a dielectric layer such as dielectric layer 64 and a protective structure such as structure 64A are not formed because gate structures 152, 154, 156, and 158 serve as protective structures.

Figure 13:
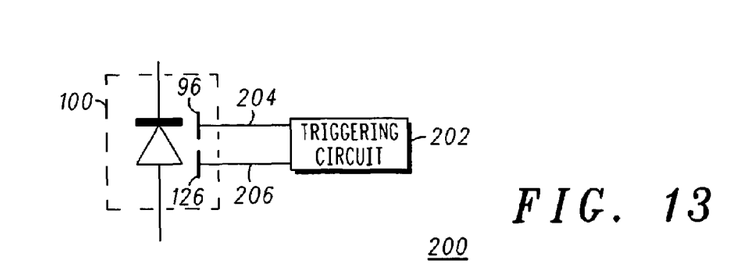
FIG. 13 is a schematic diagram of an ESD protection network having a gate biasing circuit coupled to an ESD protection element in accordance with an embodiment of the present invention.

FIG. 13 is a circuit schematic 200 illustrating a triggering or biasing circuit 202 for controlling a gated diode such as, for example, dual-gated lateral diode 100. More particularly, triggering circuit 202 has an output terminal 204 coupled to gate electrode 96 and an output terminal 206 coupled to gate electrode 126 of dual-gated lateral diode 100.

In operation, triggering circuit 202 applies logic voltages to gate electrodes 96 and 126 to control the operating mode of dual-gated lateral diode 100. In a normal operating mode (i.e., in the absence of a transient electrical signal such as an electrostatic discharge event), triggering circuit 202 biases dual-gated lateral diode 100 so that it is configured as two series-connected diodes. In this mode, triggering circuit 202 applies a logic high voltage to gate electrode 96 and a logic low voltage to gate electrode 126. The logic high voltage applied to gate electrode 96 fully depletes the portion of diode multiplication region 34 that is between gate structure 50 and insulating layer 18 so that it becomes a region of N-type conductivity.

Figure 14:
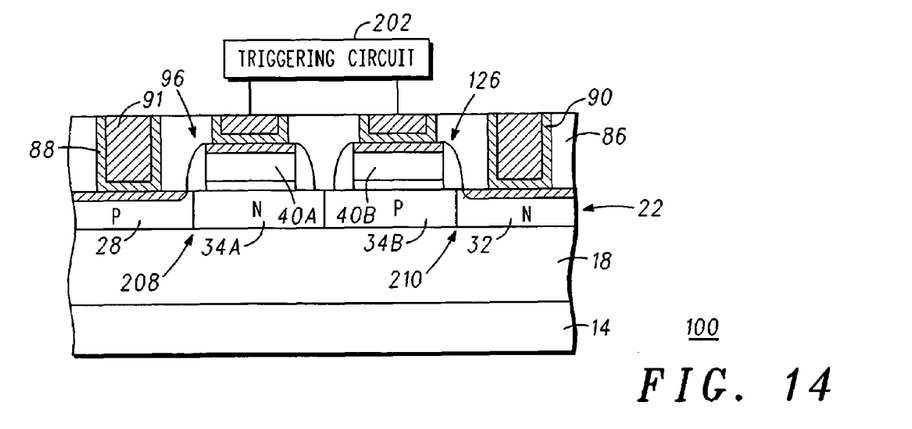
FIG. 14 is a cross-sectional side view of the ESD protection element of FIG. 13 in combination with a triggering circuit.

FIG. 14 is a cross-sectional side view of dual-gated lateral diode 100 which is coupled to triggering circuit 202 and biased in a normal mode of operation. What is shown in FIG. 14 is a cross-sectional side view of dual-gated lateral diode 100 biased to operate as two series-connected diodes, wherein the depleted or inverted portion of diode multiplication region 34 is identified by reference character 34A and the undepleted portion of diode multiplication region 34 is identified by reference character 34B. Doped region 28 which is a P-type conductivity region and portion 34A of diode multiplication region 34 which is an N-type conductivity region form a diode 208. Portion 34B of diode multiplication region 34 which is a P-type conductivity region and doped region 32 which is an N-type conductivity region form a diode 210. It should be understood that FIG. 14 is provided for the sake of clarity and that it represents dual-gated lateral diode 100 shown in FIG. 9 under biasing conditions that forms series-connected diodes 208 and 210.

When an ESD event occurs, triggering circuit 202 biases dual-gated lateral diode 100 so that it is configured as a single diode by applying a logic low voltage to gate electrodes 96 and 126. Under these bias conditions regions 28 and 34 continue to be regions of P-type conductivity and region 32 continues to be a region of N-type conductivity, thereby forming a single P-N junction diode, i.e., portion 34A continues to be P-type conductivity. It should be noted that a single P-N junction diode is also formed when triggering circuit 202 applies a logic high voltage to gate electrodes 96 and 126. Alternatively, a single P-N junction diode is formed when triggering circuit 202 applies a logic low voltage to gate electrode 96 and a logic high voltage to gate electrode 126. Preferably, triggering circuit 202 is hardwired to form subportion 34A from portion 34 of region 22 for normal operation and to leave region 34 unaltered during an ESD event.

Figure 15:
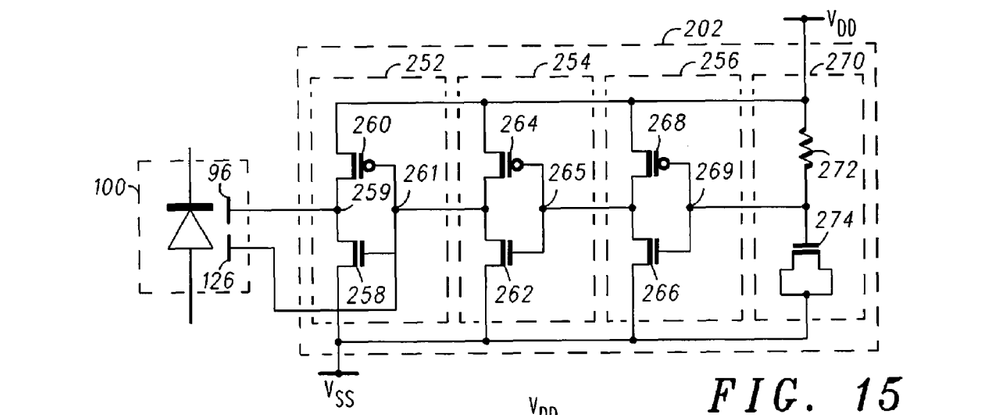
FIG. 15 is a schematic circuit diagram of an ESD protection network having a gate biasing circuit coupled to an ESD protection element in accordance with an embodiment of the present invention.

FIG. 15 is a circuit schematic of an ESD protection circuit 202 in accordance with another embodiment of the present invention. What is shown in FIG. 15 is dual-gated lateral diode 100 coupled to triggering circuit 202. Triggering circuit 202 comprises three inverters 252, 254, and 256, wherein each inverter comprises an N-channel Insulated Gate Field Effect Transistor (IGFET) coupled to a P-channel IGFET. More particularly, inverter 252 comprises an N-channel IGFET 258 having gate, source, and drain terminals and a P-channel IGFET 260 having gate, source, and drain terminals. The source terminal of N-channel IGFET 258 is coupled for receiving a source of operating potential $V_{SS}$ and the drain terminal is coupled to gate electrode 96 of dual-gated lateral diode 100 to form a node 259. The source terminal of P-channel IGFET 260 is coupled for receiving a source of operating potential $V_{DD}$ and the drain terminal is coupled to the drain terminal of IGFET 258 and to gate electrode 96 of dual-gated lateral diode 100 at node 259. The gate terminals of IGFETS 258 and 260 are coupled to each other and to gate electrode 126 of dual-gated lateral diode 100 to form a node 261.

Inverter 254 comprises an N-channel IGFET 262 having gate, source, and drain terminals and a P-channel IGFET 264 having gate, source, and drain terminals. The source terminal of N-channel IGFET 262 is coupled for receiving source of operating potential $V_{SS}$ and the drain terminal is coupled to the gate electrodes of transistors 258 and 260 at node 261. The source terminal of P-channel IGFET 264 is coupled for receiving a source of operating potential $V_{DD}$ and the drain terminal is coupled to the drain terminal of IGFET 262 and to the gate terminals of transistors 258 and 260 at node 261. The gate terminals of IGFETS 262 and 264 are coupled to each other to form a node 265.

Inverter 256 comprises an N-channel IGFET 266 having gate, source, and drain terminals and a P-channel IGFET 268 having gate, source, and drain terminals. The source terminal of N-channel IGFET 266 is coupled for receiving source of operating potential $V_{SS}$ and the drain terminal is coupled to the gate electrodes of transistors 262 and 264 at node 265. The source terminal of P-channel IGFET 268 is coupled for receiving a source of operating potential $V_{DD}$ and the drain terminal is coupled to the drain terminal of IGFET 266 and to the gate terminals of transistors 262 and 264 at node 265. The gate terminals of IGFETS 266 and 268 are coupled to each other to form a node 269.

A Resistance-Capacitance ("RC") network 270 comprising a resistor 272 and a capacitor 274 is coupled to the gate terminals of IGFETS 266 and 268. More particularly, one terminal of resistor 272 is coupled for receiving source of operating potential $V_{DD}$ and the other terminal of resistor 272 is coupled to the gate terminals of IGFETS 266 and 268 at node 269, and one terminal of capacitor 274 is coupled to resistor 272 and to the gate terminals of IGFETS 266 and 268 at node 269 and the other terminal of capacitor 274 is coupled for receiving source of operating potential $V_{SS}$. By way of example, capacitor 274 is a transistor connected in a capacitor configuration. The time constant of RC network 272 is the product of the resistance value of resistor 272 and the capacitance value of capacitor 274.

During normal operation, capacitor 274 is charged and the voltage appearing at node 269 is substantially equal to the voltage supplied by source of operating potential $V_{DD}$. The voltage appearing at node 265 is substantially equal to the voltage supplied by source of operating potential $V_{SS}$, the voltages appearing at node 261 and gate electrode 126 are substantially equal to the voltage supplied by source of operating potential $V_{DD}$, and the voltages appearing at node 259 and gate electrode 96 are substantially equal to the voltage supplied by source of operating potential $V_{DD}$. Accordingly, a logic high voltage appears on gate electrode 96 and a logic low voltage appears on gate electrode 126 and dual-gated diode 100 is configured as two series-connected diodes as shown in FIG. 14.

During an ESD event, capacitor 274 discharges thereby lowering the voltage appearing at node 269 so that it is substantially equal to the voltage supplied by source of operating potential $V_{SS}$. The voltage appearing at node 265 is substantially equal to the voltage supplied by source of operating potential $V_{DD}$, the voltages appearing at node 261 and gate electrode 126 are substantially equal to the voltage supplied by source of operating potential $V_{SS}$, and the voltages appearing at node 259 and gate electrode 96 are substantially equal to the voltage supplied by source of operating potential $V_{SS}$. Thus, dual-gated lateral diode 100 is configured as a single diode. Forming a single diode during and ESD event is advantageous because it has a lower "on" voltage than the series-connected diodes, which ensures that dual-gated lateral diode 100 turns on quickly during an ESD event to prevent damage to the circuitry on the semiconductor chip.

Figure 16:
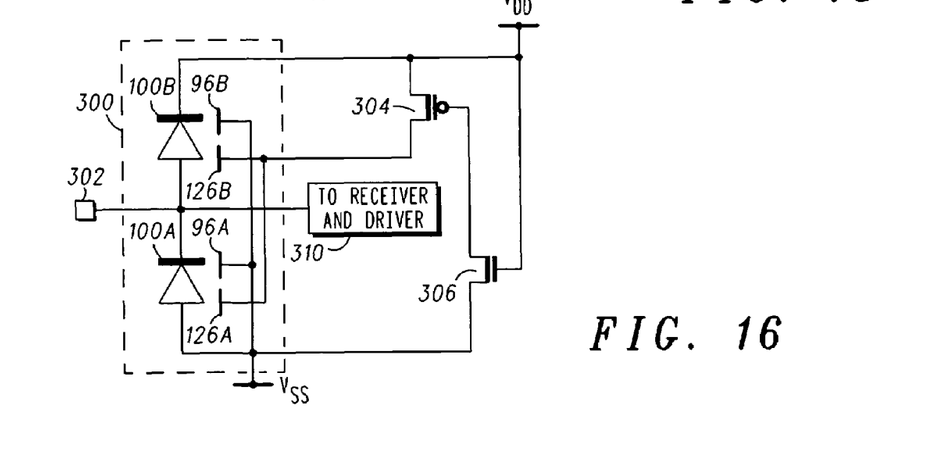
FIG. 16 is a schematic circuit diagram of an ESD protection network having a gate biasing circuit coupled to an ESD protection element in accordance with another embodiment of the present invention.

FIG. 16 is a circuit schematic of an ESD protection circuit 202 in accordance with another embodiment of the present invention. What is shown in FIG. 16 is an ESD protection network 300 comprising two dual-gated lateral diodes 100A and 100B coupled to insulated gate field effect transistors ("IGFETS") 304 and 306, to receiver and driver circuitry 310 of the chip, and to an I/O pad 302. Dual-gated lateral diode 100A has a cathode, an anode, a gate electrode 96A and a gate electrode 126A and dual-gated lateral diode 100B has a cathode, an anode, a gate electrode 96B and a gate electrode 126B. It should be noted that each dual-gated lateral diode 100A and 100B is similar to dual-gated lateral diode 100 shown in FIG. 9; hence the letters "A" and "B" have been appended to reference characters 100, 126, and 96 to distinguish between the diodes and to show their similarity. For example, dual-gated lateral diode 100 has gate electrodes 96 and 126, whereas dual-gated lateral diode 100A has gate electrodes 96A and 126A and dual-gated lateral diode 100B has gate electrodes 96B and 126B. Each IGFET 304 and 306 has a control electrode and a pair of current conducting electrodes.

The anode of dual-gated lateral diode 100A is coupled for receiving source of operating potential $V_{SS}$ and the cathode of dual-gated lateral diode 100A is coupled to the anode of dual-gated lateral diode 100B. The cathode of dual-gated lateral diode 100A and the anode of dual-gated lateral diode 100B are coupled to an I/O pad 302 and to receiver and driver circuitry 310. The cathode of dual-gated lateral diode 100B is coupled for receiving a source of operating potential $V_{DD}$. Control electrodes 96A and 96B are coupled for receiving source of operating potential $V_{SS}$. Control electrodes 126A and 126B are coupled to a drain electrode of a P-channel IGFET 304. A source electrode of P-channel IGFET 304 is coupled for receiving source of operating potential $V_{DD}$. The gate electrode of P-channel IGFET 304 is coupled to a drain electrode of IGFET 306. The source electrode of IGFET 306 is coupled for receiving source of operating potential $V_{SS}$ and a gate electrode of IGFET 306 is coupled for receiving source of operating potential $V_{DD}$.

During normal operation, gate electrodes 96A and 96B are coupled for receiving a logic low voltage, e.g., source of operating potential $V_{SS}$. Because the gate electrode of N-channel IGFET 306 is coupled for receiving source of operating potential $V_{DD}$ and the source electrode of N-channel IGFET 306 is coupled for receiving source of operating potential $V_{SS}$, N-channel IGFET 306 is "on" and the voltage appearing at the drain electrode of N-channel IGFET 306 is substantially equal to a logic low voltage. Hence the voltage appearing at the gate electrode of P-channel IGFET 304 is substantially equal to a logic low voltage. Because, the source electrode of IGFET 304 is coupled for receiving source of operating potential $V_{DD}$, the voltage appearing at gate electrodes 126A and 126B is at a logic high voltage level. Therefore, dual-gated lateral diodes 100A and 100B are each configured as two series-connected diodes.

During an ESD event, transistors 304 and 306 become non-conducting causing logic low voltages to appear at gate electrodes 126A and 126B and configuring each dual-gated lateral diode 100A and 100B as a single diode.

Figure 17:
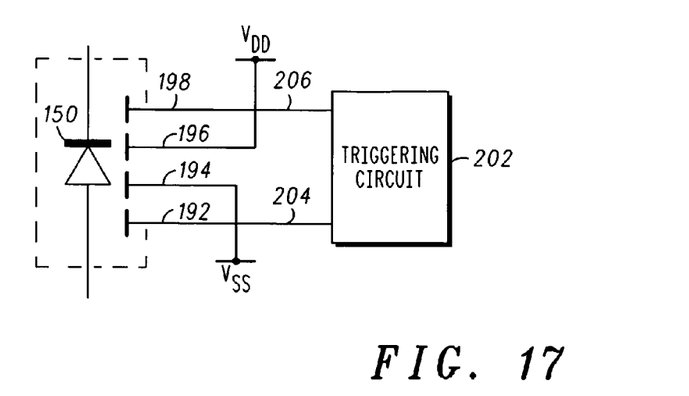
FIG. 17 is a schematic circuit diagram of an ESD protection network having a gate biasing circuit coupled to an ESD protection element in accordance with another embodiment of the present invention.

FIG. 17 is a schematic diagram illustrating triggering or biasing circuit 202 for controlling a gated diode such as, for example, multi-gated lateral diode 150. More particularly, triggering circuit 202 has an output terminal 204 coupled to gate electrode 192 and an output terminal 206 coupled to gate electrode 198. Gate electrodes 194 and 196 of multi-gated lateral diode 150 are coupled for receiving sources of operating potential $V_{DD}$ and $V_{SS}$, respectively. In other words, a logic high voltage is applied to gate electrode 196 and a logic low voltage is applied to gate electrode 194.

Figure 18:
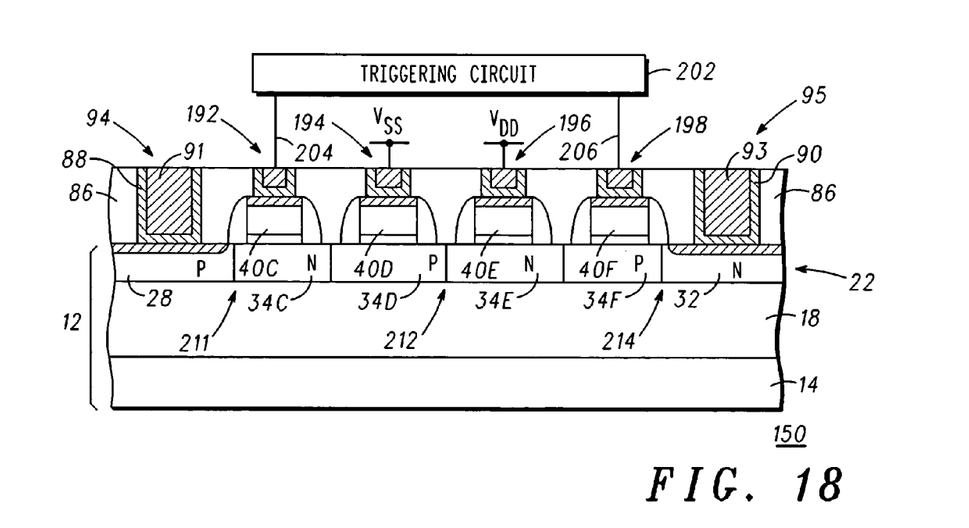
FIG. 18 is a cross-sectional side view of the ESD protection element of FIG. 17 in combination with a triggering circuit.

FIG. 18 is a cross-sectional side view of multi-gated lateral diode 150 which is coupled to triggering circuit 202 and biased in a normal mode of operation. The operation of multi-gated lateral diode is described with reference to FIGS. 17 and 18.

In operation, the logic low voltage applied to gate electrode 196 fully depletes or inverts the portion 34E of diode multiplication region 34 that is between gate structure 40E and insulating layer 18. Thus, portion 34E becomes a region of N-type conductivity semiconductor material. Because gate electrode 194 is biased with a logic low voltage level, portion 34D of diode multiplication region 34 remains a semiconductor region of P-type conductivity.

Triggering circuit 202 applies logic voltages to gate electrodes 192 and 198 for controlling the operating mode of dual-gated lateral diode 150. During a normal operating mode, triggering circuit 202 biases dual-gated lateral diode 150 so that it is configured as three series-connected diodes. In this mode, triggering circuit 202 applies a logic high voltage to gate electrode 192 and a logic low voltage to gate electrode 198. The logic high voltage applied to gate electrode 192 fully depletes or inverts sub-portion 34C of diode multiplication region 34 that is between gate structure 192 and insulating layer 18 so that it becomes a region of N-type conductivity. Because a logic low voltage level is applied to gate electrode 198, sub-portion 34F continues to be a region of P-type conductivity. Doped region 28 which is a P-type conductivity region and sub-portion 34C which is an N-type conductivity region form a diode 211. Sub-portion 34D which is a P-type conductivity region and sub-portion 34E which is an N-type conductivity region form a diode 212. Sub-portion 40F which is a P-type conductivity region and doped region 32 which is an N-type conductivity region form a diode 214. It should be understood that sub-portions 34C and 34D are formed from a portion of substrate region 22 and sub-portions 34E and 34F are formed from another portion of substrate region 22.

When an ESD event occurs, triggering circuit 202 biases multi-gated lateral diode 150 so that it is configured as a single diode. Preferably, triggering circuit 202 applies a logic low voltage to gate electrode 192 and a logic high voltage to gate electrode 198. Under these bias conditions region 28 and sub-portions 34C, and 34D are regions of P-type conductivity region and sub-portions 34E, 34F, and region 32 are regions of N-type conductivity, thereby forming a single P-N junction diode.

It should be understood other biasing schemes may be used to form the series-connected diodes and the single P-N junction diode. For example, regions 34D, 34E, and 34F may be biased with high voltages and region 34C may be biased with a low voltage.

By now it should be appreciated that an ESD protection network having reduced capacitance and leakage current during normal operation and a method for forming series-connected diodes have been provided. One or more asymmetric gate structures are formed on a portion of an SOI layer that is between two doped regions. During normal operation, the gate structures are biased to invert or change the conductivity type of least one region in the SOI layer thereby forming an additional P-N junction region that serves as a diode. During an ESD event, the biasing is changed to switch the at least one region back to its original conductivity type. This reduces the number of diodes and enables the ESD protection network to more quickly provide protection against an ESD event. Thus, the method allows for dynamically changing the number of diodes coupled in series. It is advantageous to operate with one or more series-connected diodes during normal operation because the series-connected diodes increase the turn-on voltage for the diodes ensuring they do not turn on during normal operation. The series-connected diodes also decrease the capacitance and the leakage current of the diode network. When an ESD event occurs, decreasing the number of diodes also decreases the voltage needed to turn on the diode structure. An advantage of decreasing the capacitance of the gated diode ESD protection network is that it allows transmission of higher frequency signals through the I/O pads connected to the gated diode ESD protection network. Another advantage is that the decreased capacitance gives designers the option to make larger ESD protection devices.

Yet another advantage is that the number of diodes can be selected by selecting the number of gate structures and biasing the gate structures to form diodes in the diode multiplication region. In addition, the number of diodes is not a limitation of the present invention. For example, there can be eight diodes, ten diodes, twelve diodes, etc. Preferably, the total number of gate structures is an even number.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. An ElectroStatic Discharge (ESD) protection element, comprising:
    a semiconductor-on-insulator substrate of a first conductivity type having a major surface;
    a first doped region of the first conductivity type extending from a first portion of the major surface into the semiconductor-on-insulator substrate;
    a second doped region of a second conductivity type extending from a second portion of the major surface into the semiconductor-on-insulator substrate, wherein the first and second doped regions are laterally spaced apart from each other by a diode multiplication region including a third portion of the major surface, and wherein the third portion of the major surface is contiguous with the first and second portions of the major surface; and
    a first gate structure asymmetrically positioned on the diode multiplication region.

2. The ESD protection element of claim 1, wherein the first gate structure comprises a semiconductor material disposed on a gate dielectric material, the first gate structure having first and second sidewalls.

3. The ESD protection element of claim 2, further including a first spacer adjacent the first sidewall and a second spacer adjacent the second sidewall.

4. The ESD protection element of claim 1, wherein a thickness of the diode multiplication region is less than approximately 750 Angstroms.

5. The ESD protection element of claim 1, wherein a dopant concentration of the diode multiplication region ranges from approximately $1 \times 10^{16}$ atoms per cubic centimeter (atoms/cm$^3$) to approximately $1 \times 10^{18}$ atoms/cm$^3$.

6. An ESD protection element, comprising:
    a semiconductor-on-insulator substrate of a first conductivity type having a major surface;
    a first doped region of the first conductivity type extending from a first portion of the major surface into the semiconductor-on-insulator substrate;
    a second doped region of a second conductivity type extending from a second portion of the major surface into the semiconductor-on-insulator substrate, wherein the first and second doped regions are laterally spaced apart from each other by a diode multiplication region;
    a gate structure asymmetrically positioned on the diode multiplication region;
    a first contact situated entirely over the first doped region; and
    a second contact situated entirely over the second doped region.

7. The ESD protection element of claim 6, wherein the diode multiplication region includes a third portion of the major surface, and wherein the third portion of the major surface is contiguous with the first and second portions of the major surface.

8. The ESD protection element of claim 6, wherein the first contact includes a first silicide region formed in the first doped region and the second contact includes a second silicide region formed in the second doped region.

9. The ESD protection element of claim 6, wherein the first doped region extends from the first portion of the major surface to a layer of insulating material in the semiconductor-on-insulator substrate.

10. The ESD protection element of claim 6, wherein the second doped region extends from the second portion of the major surface to a layer of insulating material in the semiconductor-on-insulator substrate.

11. The ESD protection element of claim 7, wherein the diode multiplication region extends from the third portion of the major surface to a layer of insulating material in the semiconductor-on-insulator substrate.

12. The ESD protection element of claim 6, wherein the first gate structure comprises a semiconductor material disposed on a gate dielectric material, the first gate structure having first and second sidewalls.

13. The ESD protection element of claim 12, further including a first spacer adjacent the first sidewall and a second spacer adjacent the second sidewall.

* * * * *